United States Patent
Adam et al.

(10) Patent No.: US 7,599,618 B2
(45) Date of Patent: Oct. 6, 2009

(54) METHOD AND APPARATUS FOR SELF-TESTING OF TEST EQUIPMENT

(75) Inventors: Ian Malcolm Adam, Allentown, PA (US); William Joseph Thompson, Kempton, PA (US); Darren Leonard Winslow, Moscow, PA (US)

(73) Assignee: Circadiant Systems, Inc., Allentown, PA (US)

( * ) Notice: Subject to any disclaimer, the term of this patent is extended or adjusted under 35 U.S.C. 154(b) by 454 days.

(21) Appl. No.: 11/030,381

(22) Filed: Jan. 6, 2005

(65) Prior Publication Data

US 2006/0146318 A1 Jul. 6, 2006

(51) Int. Cl.
*H04B 10/08* (2006.01)
(52) U.S. Cl. ............... 398/16; 398/10; 398/27
(58) Field of Classification Search ............ 398/16, 398/9, 10, 25, 27; 356/73.1
See application file for complete search history.

(56) References Cited

U.S. PATENT DOCUMENTS

| | | | | |
|---|---|---|---|---|
| 4,850,045 A * | 7/1989 | Funke | | 398/16 |
| 5,086,348 A * | 2/1992 | Le Roy | | 398/2 |
| 6,816,987 B1 * | 11/2004 | Olson et al. | | 714/704 |
| 2002/0107581 A1 * | 8/2002 | Obradovic et al. | | 700/1 |
| 2003/0070126 A1 * | 4/2003 | Werner et al. | | 714/715 |
| 2003/0189701 A1 * | 10/2003 | Franke et al. | | 356/73.1 |
| 2004/0198340 A1 * | 10/2004 | Lee et al. | | 455/423 |
| 2005/0050035 A1 * | 3/2005 | Ono | | 707/3 |
| 2005/0251710 A1 * | 11/2005 | Tarango et al. | | 714/700 |
| 2005/0265717 A1 * | 12/2005 | Zhou | | 398/9 |
| 2006/0067688 A1 * | 3/2006 | Inman et al. | | 398/45 |
| 2006/0107154 A1 * | 5/2006 | Bansal et al. | | 714/738 |
| 2006/0189220 A1 * | 8/2006 | Duval et al. | | 439/760 |

OTHER PUBLICATIONS

Yi Cai et al: "Jitter Testing for Gigabit Serial Communication Transceivers"; Agilent Technologies @ 2002 IEEE.*

* cited by examiner

*Primary Examiner*—Christina Y Leung
(74) *Attorney, Agent, or Firm*—Matthew A. Pequignot; Pequignot + Myers LLC

(57) ABSTRACT

A method of self-testing includes transmitting a plurality of self-test signals and receiving the plurality of self-test signals. In addition, the method includes storing the received self-test signal in a first database; and comparing the received self-test signal with data from a second database. An self-testing apparatus and a method of for assuring substantially continued calibrated function of a testing device.

11 Claims, 13 Drawing Sheets

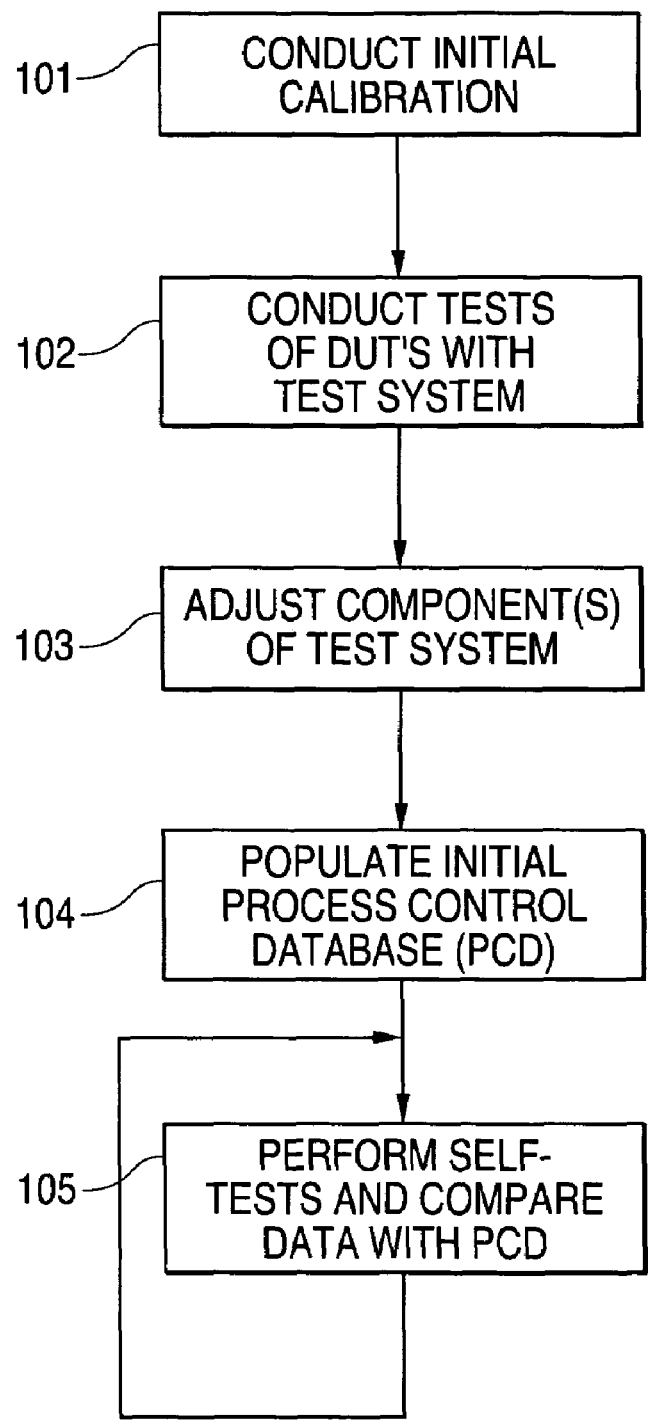

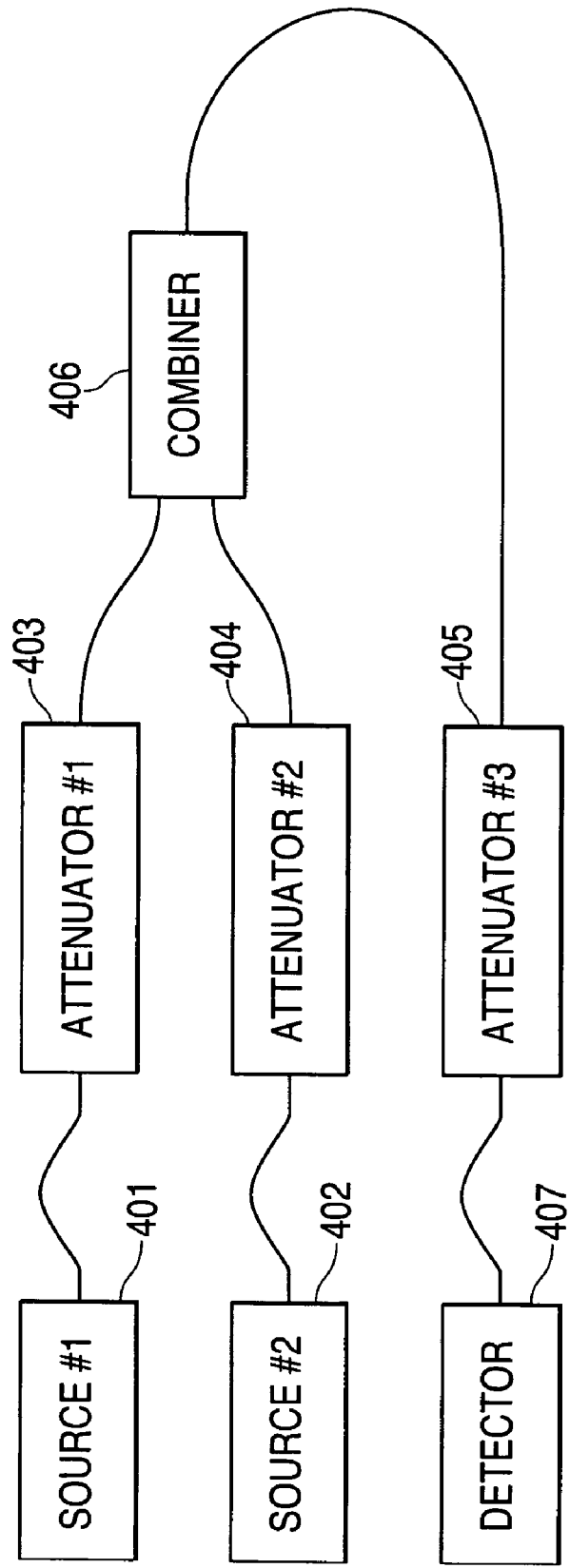

FIG. 5

METHOD AND APPARATUS FOR SELF-TESTING OF TEST EQUIPMENT

BACKGROUND

Test equipment plays a vital role in many technical areas. For example, optical communications component manufacturers have to conduct tests on their products during manufacture to ensure each product is compliant with desired specifications.

As communication rates and requirements placed on communications equipment increase, so do the demands on test equipment. For example, in optical communication systems have transmission rates on the order of Gb/s and bit error rates (BER) on the order of $10^{-12}$, the demands placed on the sensitivity and reliability of test equipment continues to increase. In addition to measuring parameters such as transmitted power and receiver sensitivity, test equipment is often relied upon for measuring the quality of digital transmissions. For example, the test equipment may be relied on to measure rise times, jitter, noise and chirp, to mention only a few.

As mentioned, the accuracy and reliability of measurements made with test equipment is of major concern in many technical areas. In an attempt to improve the accuracy of test equipment, calibration of the test equipment is carried out. The calibration of the test equipment is normally carried our in accordance with one or more requirements of a standards body. For example, the calibration standards may be in accordance with the National Institute of Science and Technology (NIST). These calibrations procedures are often carried out prior to shipment of the equipment to the customer and at periodic intervals thereafter. This recalibration is necessary to maintain the measurement quality, because it is possible that components within the test apparatus "drift" with time.

While calibration and recalibration of test equipment is important, in many instances, it is difficult for the user of the test equipment to know if the equipment remains calibrated after receipt from the manufacture or use. Thus, the test equipment may be unreliable. For example, the test equipment may have been affected during shipping or after being used for some time, or both; or the equipment may have been subjected to environmental stresses. Thus, the user of equipment may believe that the test equipment is functioning within specified limits of calibration, when in reality it is not.

As can be readily appreciated, the accuracy and reliability of test equipment over time can degrade without detection by the user. Thus, there is a need for test equipment that overcomes at least the shortcomings described above.

SUMMARY

In accordance with an example embodiment, a method of self-testing includes transmitting a plurality of self-test signals and receiving the plurality of self-test signals. In addition, the method includes storing the received self-test signal results in a first database; and comparing the received self-test signal results with data from a second database.

In accordance with another example embodiment, a testing apparatus includes a transmitter, which provides a plurality of test signals and a receiver, which receives the plurality of test signals. The testing apparatus also includes a first database that receives received data from the receiver and compares the received data to data from a second database.

In accordance with another example embodiment, a method for assuring substantially continued calibrated function of a testing device includes self-testing. The self-testing includes: transmitting a plurality of self-test signals; receiving the plurality of self-test signals; storing the received self-test signal in a first database; and comparing the received self-test signal with data from a second database.

BRIEF DESCRIPTION OF THE DRAWINGS

The invention is best understood from the following detailed description when read with the accompanying drawing figures.

FIG. 1a is a flow-chart of a method of self-testing test equipment in accordance with an example embodiment.

FIG. 4 is a simplified schematic diagram of attenuators connected to sources and a detector of test equipment in accordance with an example embodiment.

FIG. 5 is an example of the presentation at a graphic user interface (GUI) of the test equipment in accordance with an example embodiment.

DETAILED DESCRIPTION

Figure 1B:
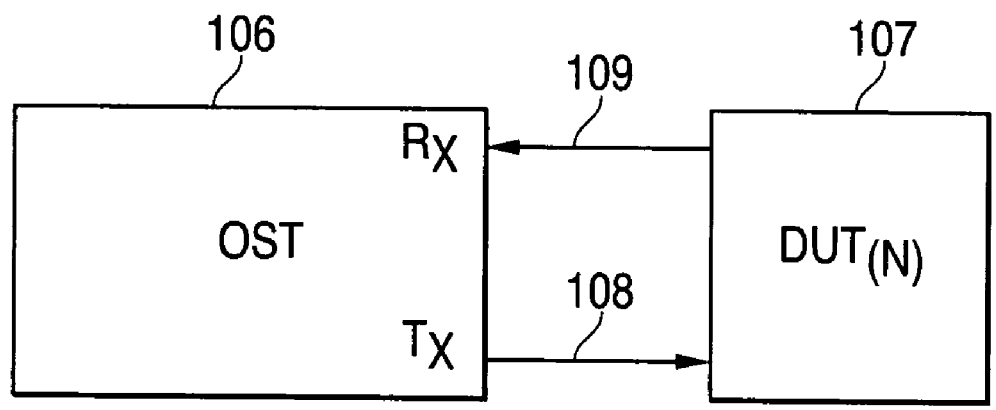
FIG. 1b is a simplified schematic block diagram of a device under test (DUT) being tested by test equipment in accordance with an example embodiment.

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known apparati and methods may be omitted so as to not obscure the description of the present invention. Such methods and apparati and methods are clearly within the contemplation of the inventors in carrying out the example embodiments. Wherever possible, like numerals refer to like features throughout.

FIG. 1a is a flow-chart of a method of testing optical and electronic test equipment in accordance with an example embodiment. It is noted that the method described primarily relates to testing devices (testers) useful in telecommunications and data communications applications. It is emphasized that this description is merely illustrative, and that the method of the example embodiment may be used in connection with other testers including, but not limited to, wireless communication devices.

At Step 101, initial calibration of test equipment is carried out. Normally, this calibration step is carried out using an oscilloscope and includes taking multiple types of measurements.

Next, at step 102, the garnering of significant data with a tester from a number of DUTs is carried out. The DUTs are a fixed set of n devices (n=integer) that are repeatedly tested by each test devices. To this end, after initial calibration, each test device is used to gather the data from this set of DUTs. As described more fully herein, the test devices will each be set to transmit a signal to each of the DUTs, where each signal is set to include the same signal characteristics.

The signal input from the tester to the DUT may be stressed through attenuation, dispersion, interference, or a combination thereof. Attenuation results in a reduction in the amplitude/strength of the signal. Dispersion results in the signal's not being sharp; making its detection by a receiver more difficult. Interference is the influence of other signals in a communication medium, which degrade the performance of a communication system. Of course these deleterious effects are merely illustrative, and there are other mechanisms for stressing a signal for testing purposes.

The purpose of stressing a signal is to emulate harsh communication conditions to test the limits of a communication system. A stressing medium(s) may be controlled by a central processing unit in the tester that introduces stresses on a signal. For example, the levels and combinations of attenuation, dispersion, interference and other phenomena may be varied in a calculated manner to test the limits of a communication system.

Usually of primary interest is whether data can be accurately transmitted from a data transmitter to a data receiver. The "accuracy" of this transfer is usually characterized and measured by a parameter: BER (Bit Error Ratio). It is the average of the number of bit errors that occurred divided by the total number of bits transferred. Depending upon circumstances, the minimum acceptable BER is typically $10^{-9}$ or $10^{-12}$. The BER depends on the data transmitter, on the transport from the transmitter to the receiver, and on the data receiver. Associated with the BER is the concept of receiver "sensitivity" and receiver "overload". The receiver's sensitivity is defined as the minimum signal power that the receiver needs to achieve a specific BER. Typically, this specific BER is $10^{-9}$ or $10^{-12}$. Depending upon details, the difference between these two choices results in a measured sensitivity change of about 1 dB (for optical receivers). Overload is the maximum power that the receiver can handle without the BER exceeding some specific BER.

FIG. 1b is a simplified schematic view of a tester 106 connected to $DUT_{(n)}$ 107 (n=integer) in order to gather the data under step 102. The tester 106 includes a transmitter (Tx) and a receiver Rx. Illustratively, the tester 106 is an OST-10D or an OST-10M optical standards tester, manufactured by Circadiant® Systems, Inc., Allentown, Pa., USA. It is noted that the term "OST" is an acronym used by Circadiant Systems for "Optical Standards Testing".

The tester 106 transmits the stressed signal 108 to $DUT_{(n)}$ 107. $DUT_{(n)}$ 107 then transmits an output signal 109 to the Rx of the tester 106. Thus, the data are acquired for $DUT_{(n)}$ 107, and the process is repeated for the other DUTs of the set of DUTs used in step 102. Illustratively, the stressed signal is transmitted from the TX with various attenuations (various power levels), and the resulting BER at the Rx is measured in order to determine the sensitivity data for the particular combination of the $DUT_{(n)}$ and the signal 108. Using this illustrative measuring sequence, a plurality of differently stressed signals are provided from the tester to the $DUT_{(n)}$ to ascertain the data for the tester. Finally, these tests are repeated on each of the n DUTs so a complete set of data is ascertained.

The data gathered in step 102 may then be compared to a large amount of data gathered from similar tests on many other testers, which have been calibrated to function within an acceptable performance level. Because the same DUTs are subjected to the same signals, variations in the test data gathered by one box from a large amount of data taken in the testing of many testers can be used to ascertain where a particular testing device is failing in its function.

At step 103, after the comparing of the data gathered in step 102 is complete, adjustments may be made in the components and/or settings of the tester to ensure its calibration is within certain defined limits of acceptable performance. These limits may include that are normally referred to as control limits of the tester. To wit, the tester may include certain parametric values garnered over the testing of the DUTs. These parametric values randomly fluctuate over time. The limits of these fluctuations define the limits of the acceptable values of the parameters. For example, if the parametric value were the sensitivity, the control limits define the upper and lower bounds of acceptable sensitivity.

If, after step 102, the data from a tester were outside these bounds, the Tx, the Rx, or both will be adjusted, in order that the sensitivity remains within these control limits. After the calibration of step 103 is completed, the method of step 102 is repeated in order to ensure the tester comports with the standards set by the control limits. If, after step 102, the data from the tester is within the bounds of the control limits, the method continues with step 104, where the initial Process Control Database (PCD) is populated.

Step 104 may include performing a series of tests with a range of signal qualities over a range of operating temperatures and over a period of time. As is known, the temperature range is the rated operating range of the instrument. Moreover, the signal quality may be intentionally affected by stresses applied to the signal by the tester 106. Typical stresses are Inter-Symbol Interference (ISI) brought about by filtering the transmitted signal; jitter of the transmitter's data clock; and added "noise" interference. In step 104, and as will be described more clearly in conjunction with certain example embodiments, the tester 106 transmits the signals from its Tx to its Rx via a loop-back. Thus, the Rx of the tester 106 is essentially a DUT, which is built-in the tester 106.

The data acquired in step 104 provides the PCD, which essentially provides the characteristics of the performance of the tester 106. Moreover, the data for each signal quality provide the baseline performance of the tester 106 for that signal quality.

Illustratively, the data acquired are the sensitivity data of the tester 106, including the control limits from step 104. Thus, the baseline of the sensitivity for each level of signal quality may be ascertained.

After the PCD has been populated in step 104, the tester 106 may be delivered to the customer for use in the field. It is noted that in production the process of steps 101-104 normally are carried out on each tester 106 during their manufacture. As such, each tester is calibrated for sale, lease, or demonstration. Thus, because each of the testers 106 is calibrated to function within certain control limits, each tester is substantially identical to the other testers similarly calibrated. Accordingly, testing on an unknown DUT is expected to yield essentially the same data taken with any of the calibrated testers.

Even if the population of testers agrees in their measurements as they are thus calibrated, they may subsequently "drift" in their performance over time due to internal "aging" of their internal components. It is a common phenomenon, for example, that most light sources will dim or become less efficient, after extensive use. Thus, self-testing is useful to ensure the tester 106 is functioning to within the data of the PCD acquired in step 104.

At step 105, the tester performs self-tests at periodic intervals and with selected signal qualities as established by the user, manufacturer, and/or installer. The self-tests are effected using a loop-back, such as described in connection with step 105. In step 105, data are acquired over time for the chosen signal qualities and for certain parameters. For example, the sensitivity may be measured for the chosen signal qualities.

After completing step 105, the data acquired are compared with those of the PCD. If it is determined that the tester is operating within the control limits used in connection with the calibration of steps 102 and 103, the tester may be used with confidence that it is functioning in the same manner as it did when it was shipped to the customer. However, if the data show that the tester 106 is functioning outside the control limits, the tester 106 is considered to be "uncalibrated." To restore its calibration, it should be returned to the manufacturer and recalibrated in keeping with steps 102 and 103; and a new PCD must be compiled in keeping with step 104.

The use of the PCD and periodic self-testing is beneficial compared to the current industrial practices of performing periodic recalibrations. Periodic recalibrations may schedule unnecessary returns for calibration or may unnecessarily delay recalibration that may be needed "before it is scheduled". This delayed recalibration may result in inaccurate testing of devices/components.

Figure 2A:
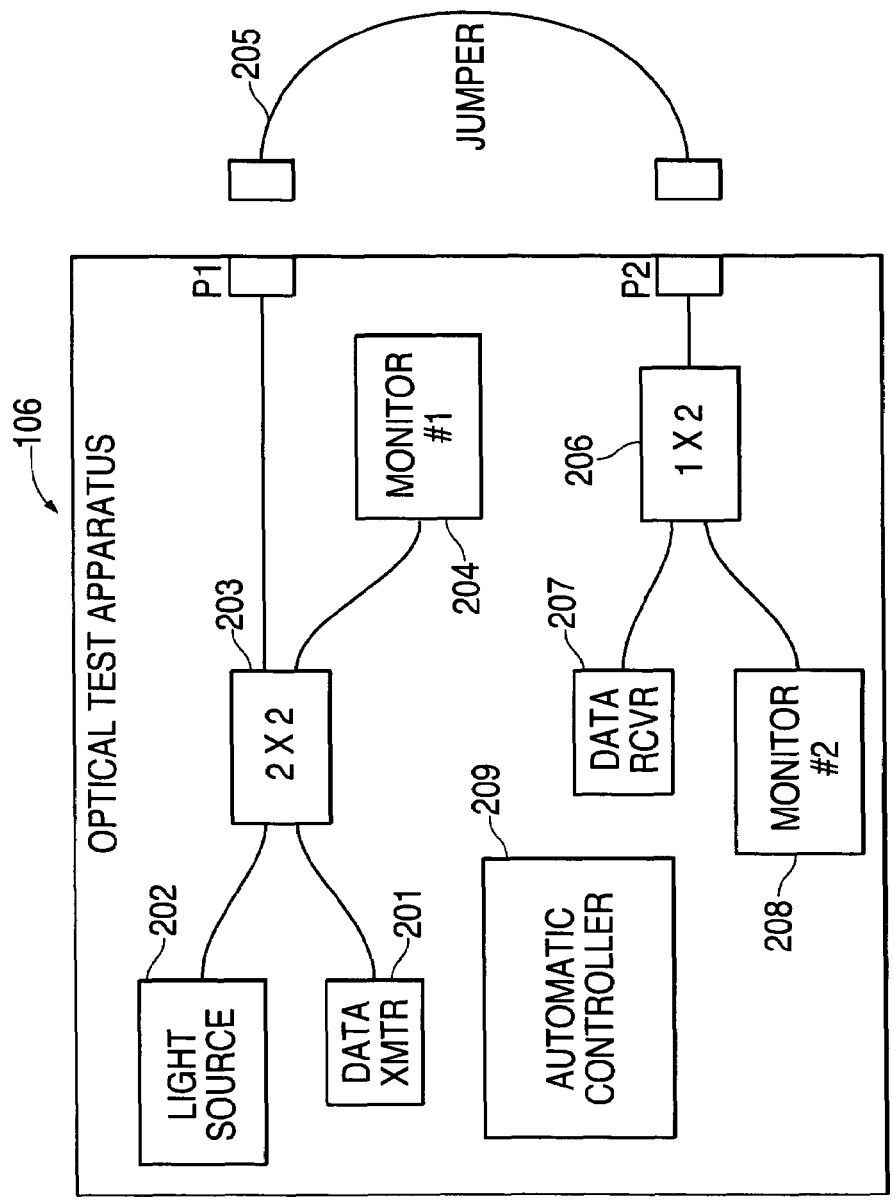
FIG. 2A is a simplified schematic block diagram of a testing apparatus in accordance with an example embodiment.

FIG. 2a is a simplified schematic block diagram of an optical test apparatus (tester) 106 in accordance with a first embodiment. The tester 106 is configured for a self-test sequence such as described in connection with step 105 of the method of FIG. 1a. Moreover, such a configuration may be used to carry out step 104 of the method as well.

A flexible test signal is generated by a data transmitter 201, which functions in combination with a light source 202, and a 2×2 coupler 203 by techniques well-known in the art of optical signal communications testing. The criteria of the signal are provided by an automatic controller 209.

Illustratively, the light source is a laser. A first port P1 is coupled to P2 by use of the jumper 205. This type of connection is often referred to as "loop-back". As shown, a portion of the signal sent via the first port P1 is tapped off to a first monitor 204. This first monitor includes electronics that provide the germane data (e.g., total average power delivered to P1) of the actual signal transmitted.

The signal from the jumper 205 is input to a second port P2 and into a 1×2 coupler 206. A portion of the signal is input to the data receiver 207 and a portion is input to the second monitor 208. By using the readings of the second monitor 208, such as the total power arriving at P2, the tester can "correct" or compensate for the coupling variations associated with the loop-back process. By comparing the readings of first monitor 204 and of the second monitor 208, variations in the loop-back process can be determined. Thus, such a self-test can be made less dependent upon the details of the jumper connection (which could vary depending upon the care and quality of the connections at ports P1 and P2 as well as of the quality of the jumper itself).

Additional choices in the self-test can be the type of data pattern chosen and the rate at which it is transmitted. The data of the signal may be "stressed" by adding noise, jitter, decreasing the modulation index or amplitude, etc. These choices expand upon the number of self-tests that can be performed as they typically lead to different sensitivity values in the data receiver, for example. If the differences in sensitivity are observed to be the same as previously observed, for example, just after calibration in step 103 of the illustrative method of FIG. 1a, then the user has confidence that the finer details of the tester 106 (e.g., OST), such as of the data receiver and of the data transmitter, such as frequency response and clock recovery, for example, are unchanged since the time of recalibration. However, if the differences in the apparent or measured sensitivity are outside the control limits, the tester 106 will need to be recalibrated in keeping with step 103.

A noteworthy aspect of the embodiments of FIGS. 1a and 2a is that there exist multiple self-tests that provide redundancy in checking the operation of the tester. To wit, not only are there several measuring elements (e.g., first monitor 204, second monitor 208, and the data receiver 207), but also there are several configurations in generating the test source. To wit the test source may be generated by turning on/off and varying the power of the light source 202 and of the data transmitter 201. It is not necessary that each of these elements is individually calibrated, rather, the automatic self-testing that is performed and recorded can be easily compared with values obtained at other times for the same set of self-tests. If the observed variations are within the control limits set at steps 102-104, the user can conclude that the optical test apparatus has not changed significantly from its last calibrated state. Thus, rather than relying upon periodic recalibrations of the apparatus, this self-testing process can determine when recalibration should be done based upon the degree of variation of all of the self-tests.

Moreover, in order to provide additional flexibility, instead of recording the results of each and every self-test automatically, the operator may be queried by the tester as to whether the recording not be done (in case there is an operator mistake and the results should be discarded, for example). Examples of operator error could include: failing to allow the apparatus to warm up completely; operation outside of the environmental specifications; and improper loop-back configuration.

Figure 2B:
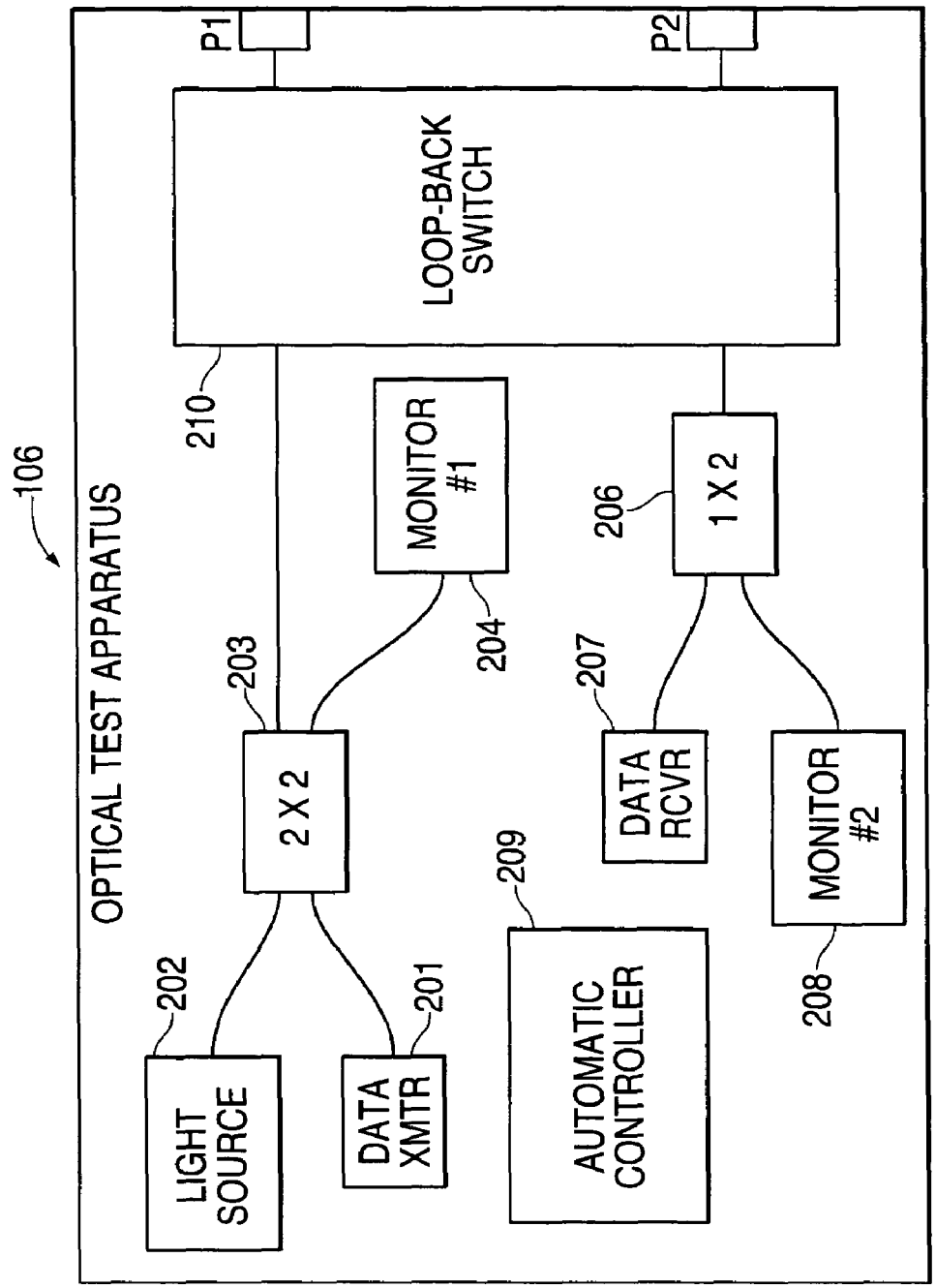
FIG. 2B is a simplified schematic block diagram of a testing apparatus in accordance with another example embodiment.

FIG. 2B is a simplified schematic block diagram of a second embodiment. The second embodiment is similar to the embodiment described in connection with FIG. 2a. Thus, in order to avoid obscuring the description of the present example embodiment, descriptions of common features are omitted. The tester 106 of FIG. 2b includes an internal loop-back switch 210 so that the user does not need to externally connect a jumper in preparation to self testing. The operator making and breaking connections at P1 and P2 could introduce unwanted variability; this is obviated with the use of the internal loop-back switch. The loop-back switch 210 is set in two possible states: "loop-back" and "normal". In "loop-back", the loop-back switch 210 establishes a connection between the signal path coming from the transmitter side and the signal path leading to the receiver side, both within the test apparatus. In "normal", two paths are restored: (1) the signal path coming from the transmitter side and leading to port P1, and (2) the signal path from port P2 and leading to the receiver side.

It is usually possible for the controller 209 to operate this switch to more completely automate the self-testing processes.

Figure 2D:
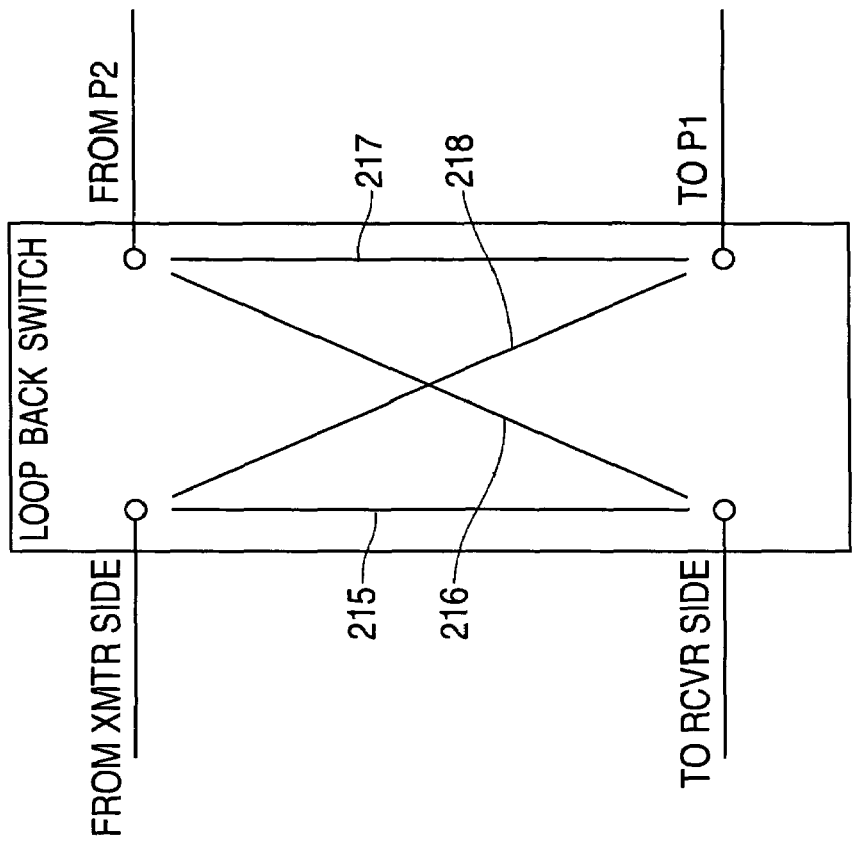
FIGS. 2C and 2D are simplified schematic block diagrams of loop-back switches in accordance with example embodiments.
Figure 2C:
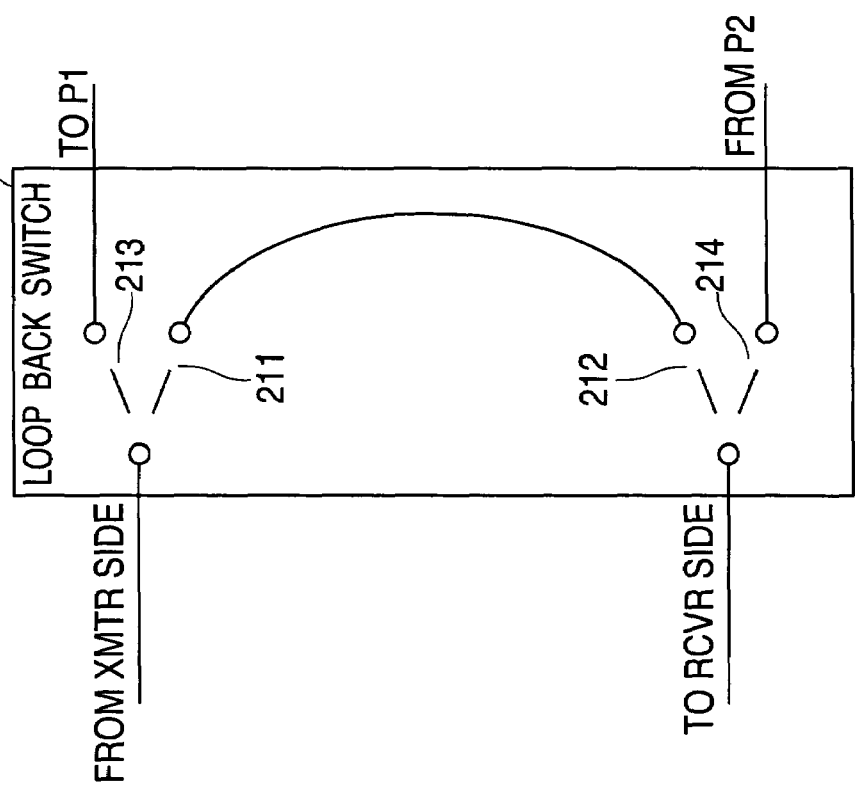

FIGS. 2C and 2D schematically illustrate two examples of loop-back switches. Although not expressly shown, it is noted that the loop-back switch 210 could be mounted on a bulk head of the tester 106 so that it would have ports P1 and P2 integrated within the loop-back switch and would be maintained on the bulkhead as a result of this mounting arrangement.

FIG. 2C could be thought of as "DPDT" (Double Throw, Double Pole). The "loop-back state" is achieved by engaging switch connections 211 and 212. The "normal state" is achieved by engaging switch connections 213 and 214 (connections 211 and 212 not being engaged). Notice that at no time is the loop-back switch connecting ports P1 and P2 with each other.

FIG. 2D can be thought of as a "2-by-2". The "loop-back state" is achieved by engaging switch connections 215 and 217 (connections 216 and 218 not being connected during loop-back). The "normal state" is achieved by engaging switch connections 216 and 218 (connections 215 and 217 not being connected). Notice here that for the "loop-back state", the loop-back switch does connect ports P1 and P2 with each other.

Beneficially, by virtue of the example embodiment, recalibration is only performed when needed, instead of on a periodic basis. This provides a greater degree of confidence that the testing is within calibration at all times and that one is not expending resources (time and money) unnecessarily. Another unfortunate consequence of performing unnecessary recalibrations is the danger of introducing spurious variations due to technician errors, due to bugs in the calibration procedure, or due to additional "wear and tear" on the equipment (such as a result of shipping back and fourth the test equipment to the manufacturer).

Figure 3A:
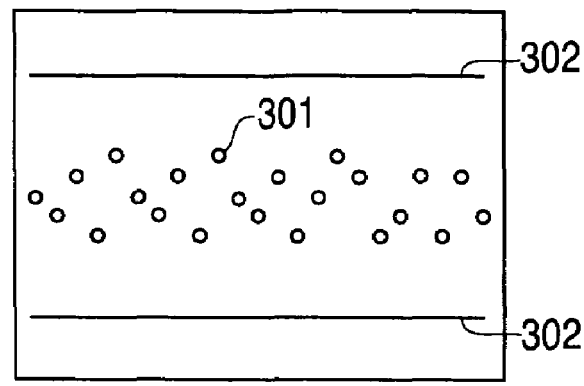
FIGS. 3A, 3B and 3C are control charts including test data in accordance with example embodiments.
Figure 3B:
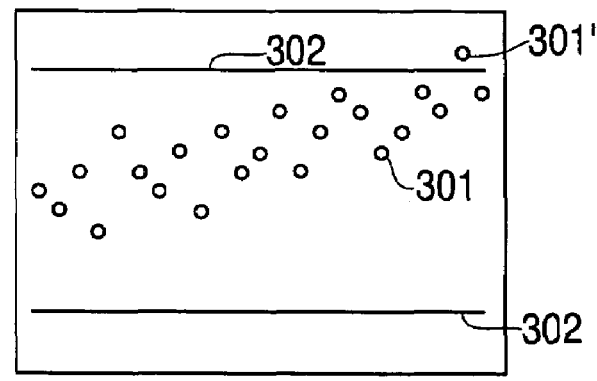
Figure 3C:
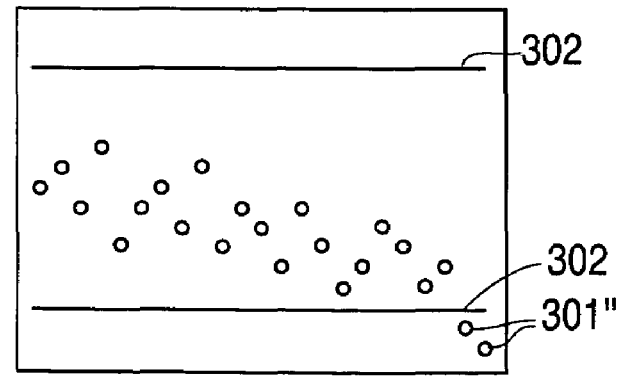

For determining trends in the self-testing processes (and the underlying internal device parameters that these self-tests probe), control charts are useful. FIGS. 3A, 3B, and 3C are examples of particular control charts that might be produced during self-testing of step 105 and during the initial calibration of steps 102 and 103. If desired, the control charts can be produced by the tester itself without the need for a separate controller. Each point (small circle) 302 on the control chart represents the results of one or more self-tests that have been combined to form a parametric result that is plotted vertically. The horizontal axis is typically a chronological one (which hour, day, week, month, etc). Often control charts are made where there are lines drawn between successive points; this is a matter of personal taste and does not impact upon the analyses that can be performed.

The parametric result being plotted could be, for example, receiver sensitivity for fixed data pattern, stress and data rate less the receiver sensitivity for a different fixed data pattern, stress, and data rate. In this example, the differential sensitivity would be expected to be largely unaffected by variability in the loop-back connections.

FIG. 3A shows random fluctuations in the parametric result. The pair of horizontal lines 302 is the control limits described previously. As long as the points 301 fall between these two lines, the parametric result is "within limits". As described above, these control limits 302 are chosen based upon the manufacturer's experience and the degree of constancy that can be reasonably demanded of the equipment, and the accuracy expected of the test apparatus.

FIG. 3B shows a similar degree of random fluctuation but in addition there appears to be a long term trend toward a higher parametric result. If the y-axis represents time, the most recent times includes point 301' (parametric results) that have exceeded the control limit 302. This occurrence could be used to suggest that it is time to take the test apparatus out of service until it is recalibrated. This recalibration would include, for example, repeating steps 102-104 of the method of FIG. 1a. Of course, this is not the only choice; one could use a moving average as the criterion for recalibration.

FIG. 3C shows a similar degree of random fluctuation but in addition there appears to be a long term trend toward a lower parametric result. Toward the right-hand side of this chart (most recent times), two of the points 301" (parametric results) have exceeded the control limit 302. The first occurrence could be used to suggest that it is time to take the test apparatus out of service until it is recalibrated. Of course, this is not the only choice. It is noted that the use of control charts and of statistical process control is well known and is an extensive field of endeavor. See, for example, "Juran's Quality Control Handbook; Fourth Edition," J. M. Juran, Editor in Chief (1988), Section 24, the disclosure of which is specifically incorporated herein by reference.

It is noted that the testers 106 may contain several variable attenuators that will reduce signal powers in a programmable manner under automatic control. The attenuators may be part of a self-test series for the testers 106 as well. FIG. 4 is a simplified schematic block diagram of attenuators of an example embodiment that are useful in the testers 106. Referring again to FIGS. 2a and 2b, a source #1 (410) could be Light Source 202 and a source #2 (402) could be data transmitter 201. Also, a combiner 406 could be with the 2×2 coupler 203. Finally, a detector 407 could be the Monitor #2 208, or to the Data Receiver 207. Although this example can apply to fiber optic testing, it also applies to radio frequency RF and to base band signaling as well. Depending upon the technology, first source 401 and second source 402 can be light sources, RF generators, etc. Moreover, first, second and third attenuators 403, 404 and 405, respectively, are similarly understood to be optical attenuators, RF attenuators, etc. Again, analogously, a combiner 406 is technology dependent and could be a fiber-optic combiner, an RF combiner, etc. Finally, the detector would be an optical receiver, and RF receiver, etc.

The connection between the combiner 406 and third attenuator 405 might be associated with a loop-back connection, similar to that carried out by the jumper in FIG. 2a. FIG. 4 also provides for overlapping or redundant self-testing. For example, the first source 401 could be operating and second source 402 be disabled. A detector 407 could read the power received as a function of the setting of attenuator 403; thus, the detector's power calibration is checked against attenuator 403.

If detector 407 has only the ability to determine if the power is the same as at some previous time (say because the BER is the same, for example), then one can determine the relative calibrations of attenuator 403 settings against attenuator 405. As a specific example, suppose the BER is observed to be some particular value when attenuator 403 is near its minimum value, and attenuator 405 is near its maximum value. The next test can be to increase the attenuator 403 by a fixed amount and decrease the attenuation of attenuator 405 by an amount that results in the same BER as before. This process can be repeated until one has a relative calibration of the settings of attenuator 403 compared to attenuator 405. This measured relative calibration can be stored and later compared with the corresponding results taken at a different time.

Operating source 403 and disabling source 401 enables determining the relative calibration of attenuator 404 to that of attenuator 405. If the relative calibrations of all three attenuators appear unchanging, one has greater confidence in all three attenuators than if one only had been monitoring the relative calibrations of fewer devices. It is with multiple self-tests showing little change that the data supports that all of the test apparatus is unchanged in its calibration. In addition, with increased redundant testing, it may be possible to more accurately determine which sub-portions of the test apparatus have not been changing and which sub-portions have changed. The nature of the testing methodology is that certain parts of the testing are inherently less stable and compensations may need to be supplied. An example of less expected stability might be in the loop-back connections supplied by an operator-mediated jumper connection.

Figure 5:
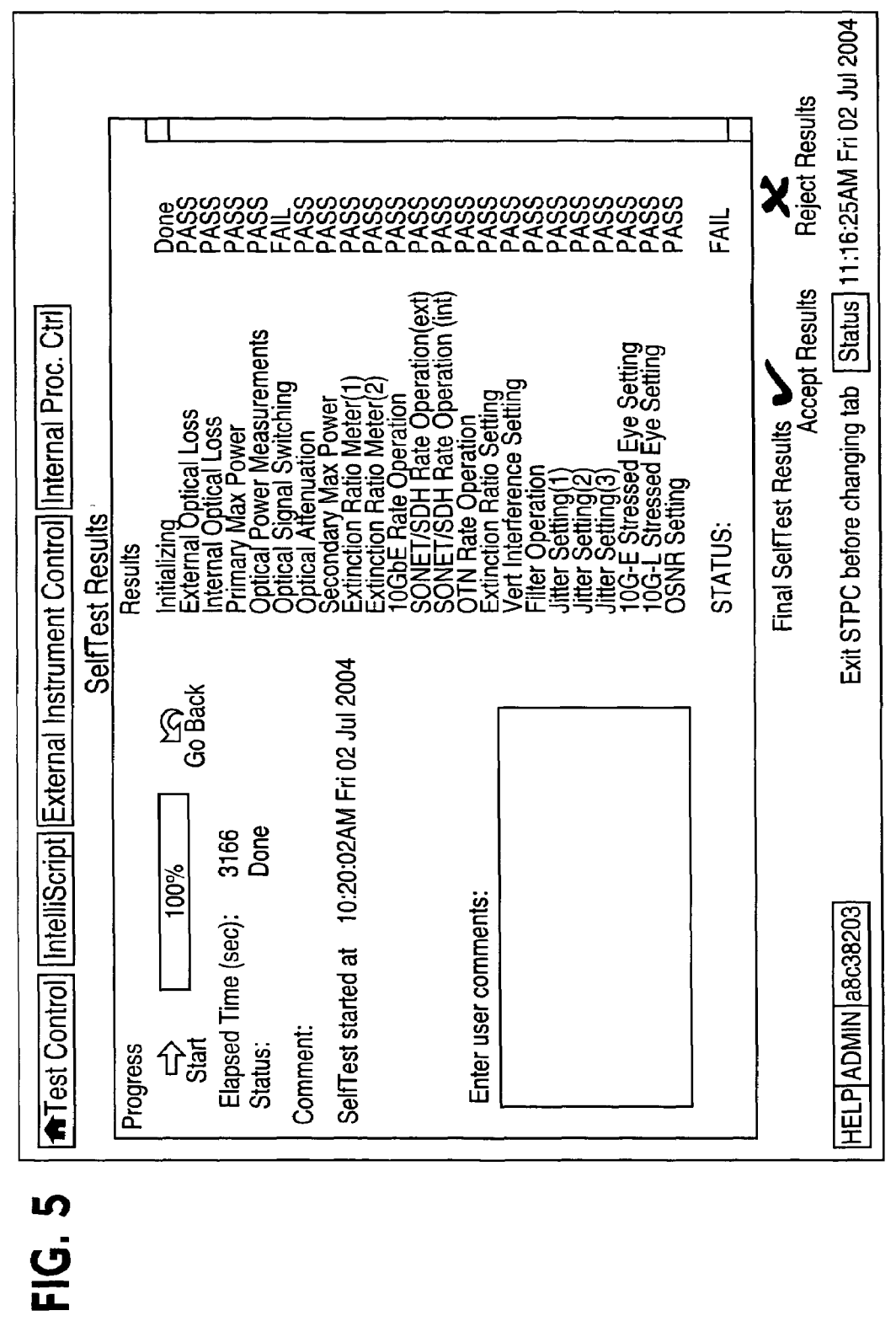

FIG. 5 shows a GUI display of an example of automatic self-testing. It is selected here with "Internal Proc. Ctrl.". As can be seen, there are twenty-two separate steps. The first step is "Initializing". Subsequently there are 22 separate self-tests performed in the order presented. As each self-test is performed a summary of "PASS" or "FAIL" is displayed.

In this example, the first eight self-tests are performed to determine if operational capability is still adequate to operate under all conditions and configurations that the tester is designed to operate under. The remaining thirteen self-tests are performed for determining if the instrument is still close to its last calibrated state. The results of the self-tests lead to control charts indicating the stability of the tester. The actual nature and the number of tests are chosen for the type of tester and what is presented here is only a particular example.

In FIGS. 6A through 6M the control charts of the 13 computed parameters are presented as examples. The control charts of FIGS. 6A through 6M may be used as the PCD database described previously. As a convenience, all of the control charts start with the computed parameters centered about 0. This is achieved by the self-tests being performed as the last step in the factory calibration procedure. The computed parameters at that time are experimentally determined and used to subtract from subsequently determined computed parameters. To provide many examples, below are descriptions of each computed parameter used in the control charts.

Figure 6A:
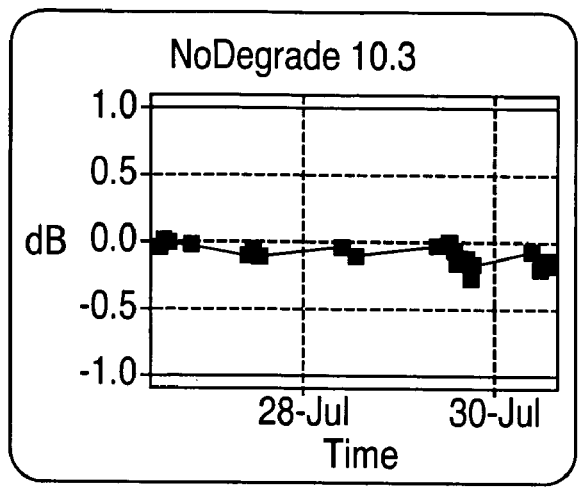
FIGS. 6A-6M graphical representations of control charts generated in accordance with example embodiments.

In FIG. 6A the computed parameter is the measured sensitivity of the internal optical digital receiver (compared to the initial calibrated result). The testing pattern is generated by the internal data transmitter using a PRBS (Pseudo Random Bit Sequence) operating at 10.3 Gb/s. There are no attempts to degrade the test signal. In the absence of statements to the contrary, this same data rate is used in the other tests.

Figure 6B:
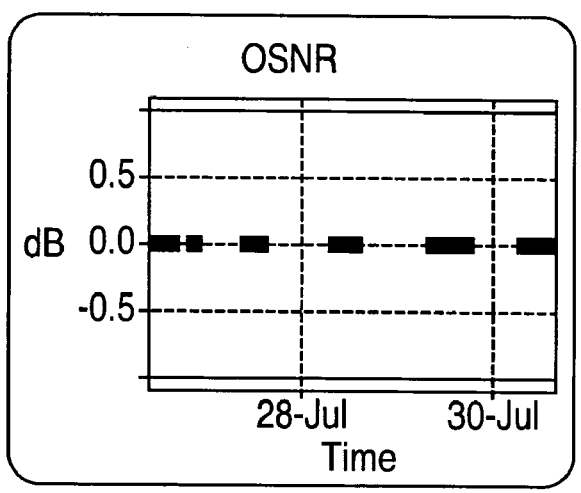

In FIG. 6B the computed parameter is the relative change in receiver sensitivity with a fixed amount of OSNR (Optical Signal-Noise Ratio).

Figure 6C:
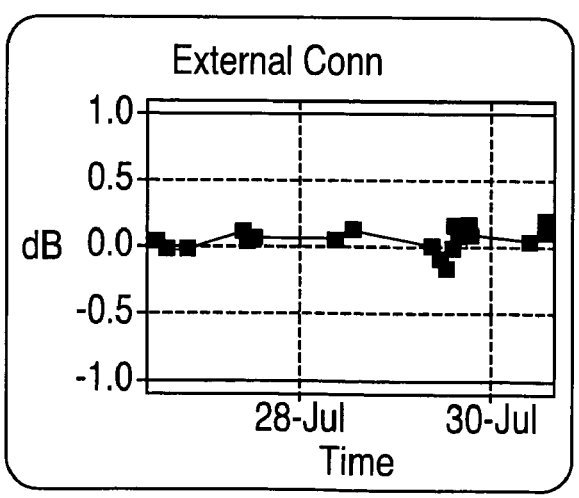

In FIG. 6C the loss in the external jumper and its connections to the tester are determined and (as always here, the factory value is subtracted off). As the intrinsic loss of a short fiber-optic jumper is usually very small (unless it is damaged), the observed losses are almost entirely related to fluctuations in the connections.

Figure 6D:
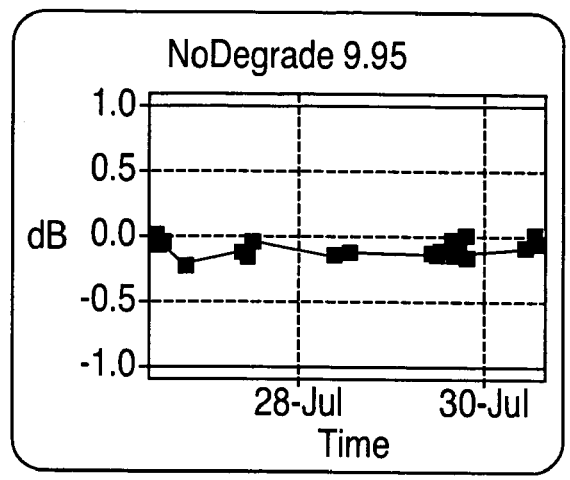

In FIG. 6D the test signal is transmitted at 9.95 Gb/s, otherwise, the measurement is the same as described in FIG. 6A.

Figure 6E:
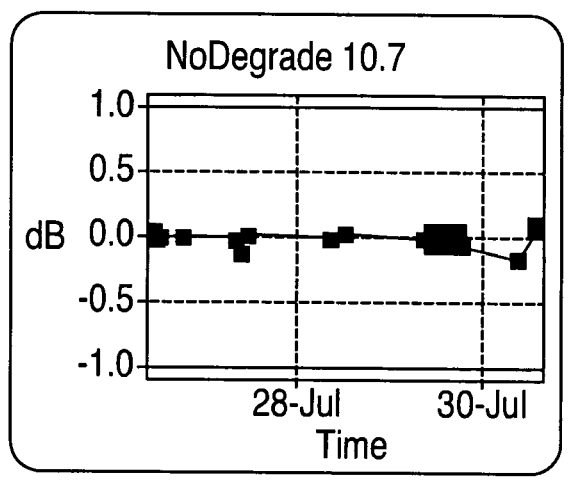

In FIG. 6E the test signal is transmitted at 10.7 Gb/s, otherwise, the measurement is the same as described in FIG. 6A.

Figure 6F:
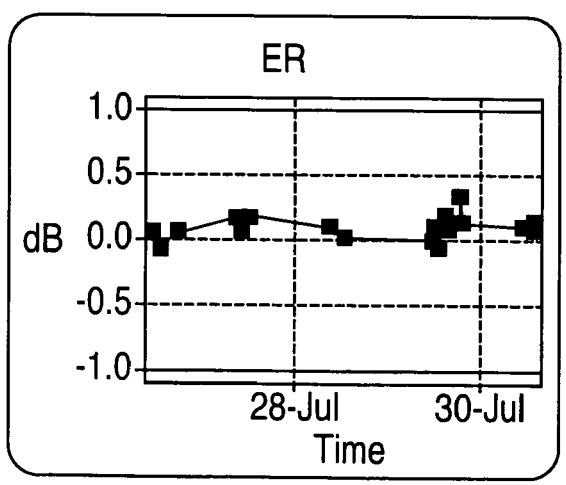

In FIG. 6F the test signal is degraded by reduction in the ER (Extinction Ratio) to a standard set level at the transmitter side. This degradation results in the measured receiver sensitivity that is worse than it would be with the undegraded test signal. The difference in measured sensitivity is calculated and it is compared to the factory-determined difference.

Figure 6G:
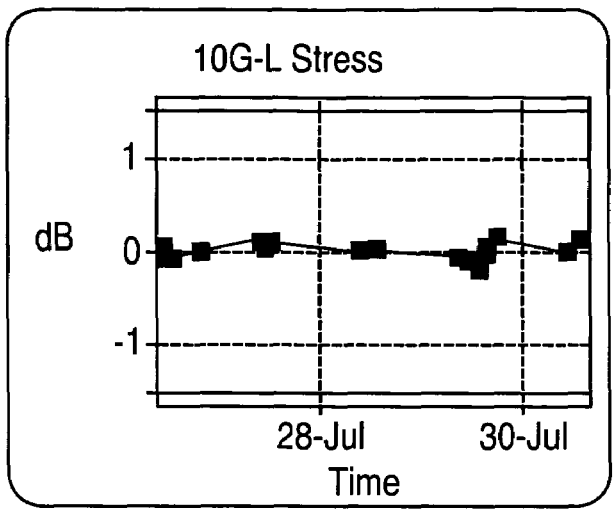
Figure 6H:
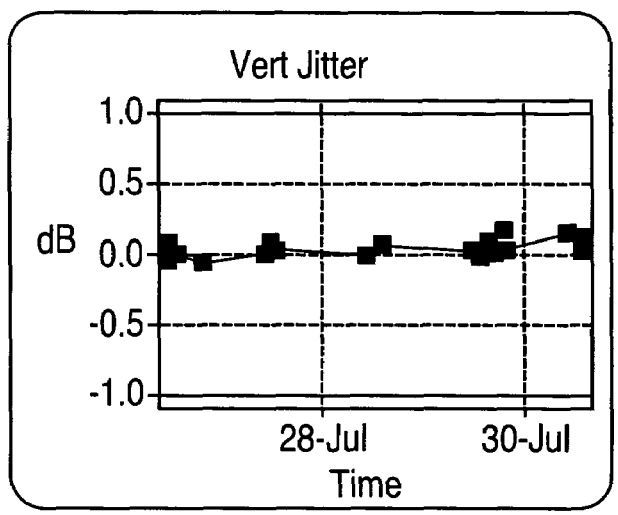

In FIG. 6H the test signal is degraded instead by the addition of a fixed amount of "vertical jitter". This degradation is analogous to adding rapidly changing, time dependent ER to the transmitted signal. This degradation results in the measured receiver sensitivity that is worse than it would be with the undegraded test signal. The difference in measured sensitivity is calculated and it is compared to the factory-determined difference.

Figure 6I:
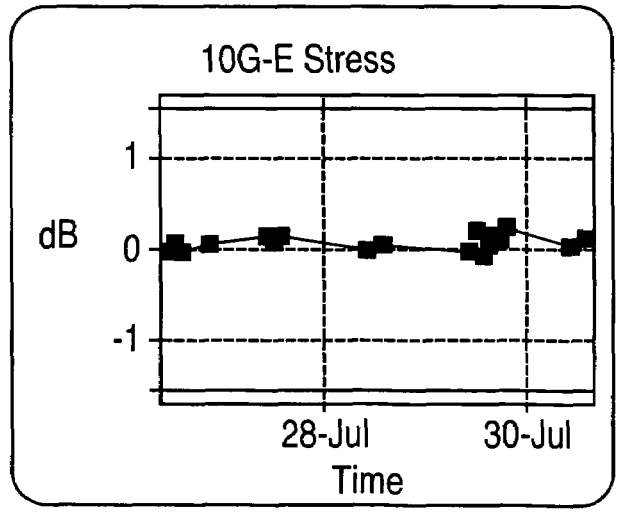

In FIGS. 6G and 6I the test signal is stressed as specified in the IEEE 802.3ae standard (10GBASE-L and 10GBASE-E, respectively).

Figure 6J:
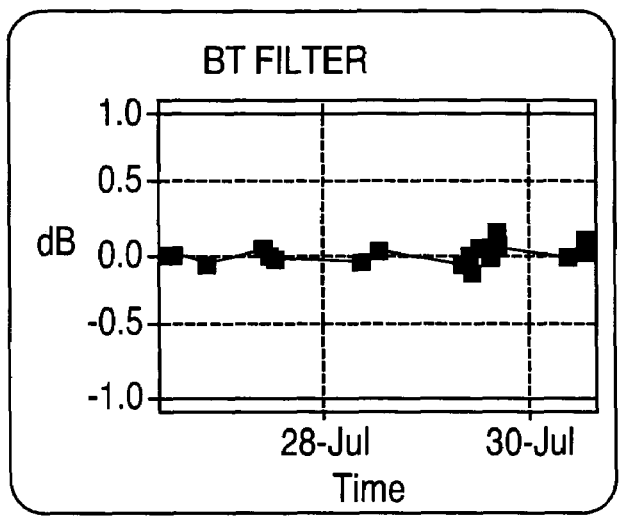

In FIG. 6J the transmitted test signal is only degraded by the use of a Bessel-Thomson low-pass filter. The reduction of high frequency components in the test signal results in a poorer observed internal data receiver sensitivity. The difference in measured sensitivity is calculated and it is compared to the factory-determined difference.

Figure 6K:
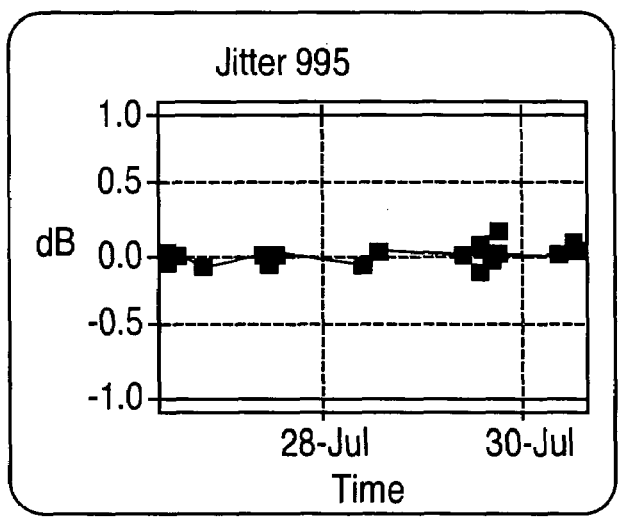

In FIG. 6K the data is transmitted at 9.95 Gb/s and is degraded by introducing a fixed amount of temporal clock jitter. This degraded signal results in a sensitivity determination of the internal data receiver that is worse than for the undegraded signal. The reduction in sensitivity is calculated and compared to the factory self-test for this same measurement.

Figure 6L:
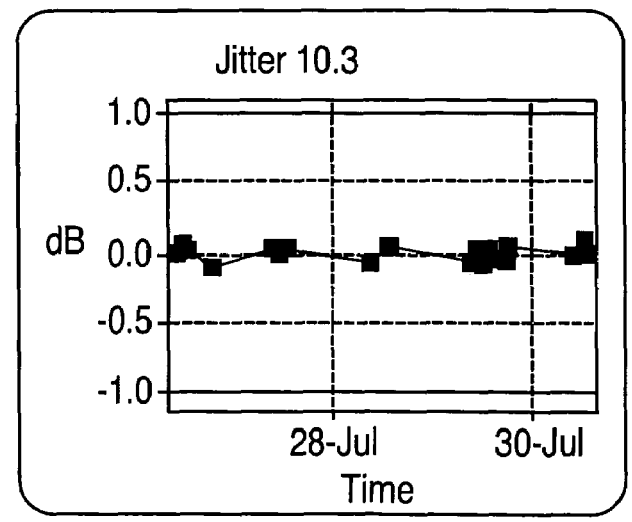

In FIG. 6L the data is transmitted at 10.3 Gb/s and is degraded by introducing a fixed amount of temporal clock jitter. This degraded signal results in a sensitivity determination of the internal data receiver that is worse than for the undegraded signal. The reduction in sensitivity is calculated and compared to the factory self-test for this same measurement.

Figure 6M:
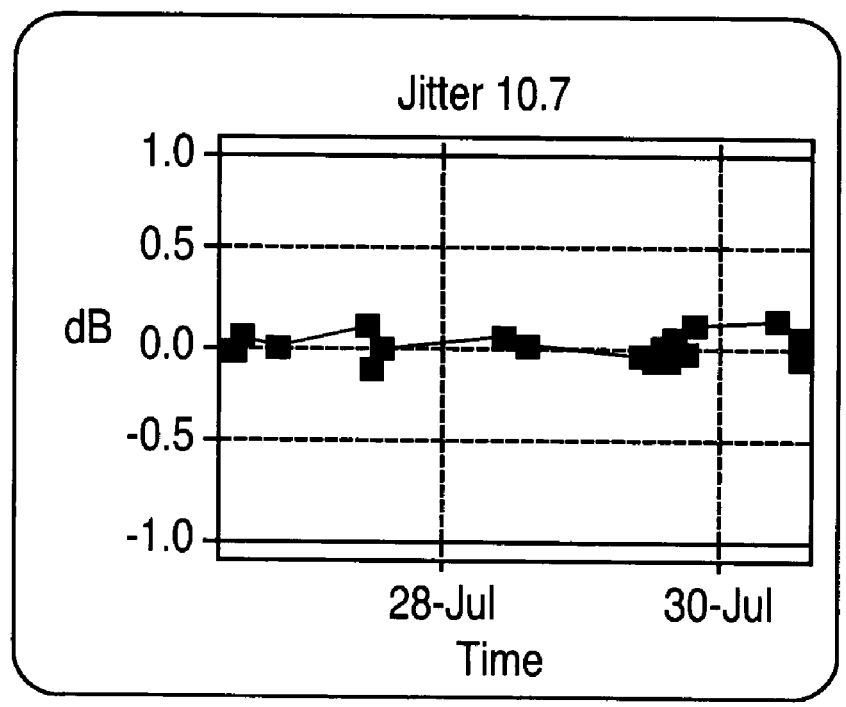

In FIG. 6M the data is transmitted at 10.7 Gb/s and is degraded by introducing a fixed amount of temporal clock jitter. This degraded signal results in a sensitivity determination of the internal data receiver that is worse than for the undegraded signal. The reduction in sensitivity is calculated and compared to the factory self-test for this same measurement.

As can be appreciated from FIGS. 6A-6M, for example, changes in the internal transmitter and/or in the internal receiver of the tester 106 will show up as changes of some or all of the computed parameters. In addition, changes in the jitter and Bessel-Thompson filtering will show up as changes in the computed parameters. There does not have to be a one-to-one correspondence of any particular component to any particular calculated parameter. The main consideration is that the self-tests collectively involve all the components of the tester that need to be monitored. Also, that the self-tests are sufficiently diverse that it is exceedingly unlikely that even if two or more components of the tester were to change, even if those changes would result in "canceling of changes" for a particular calculated parameter, it would not be canceling of changes for at least one other computed parameter.

The choice of the character of each self-test, which self-tests should be performed, and how the parametric results combined, stored and displayed can be driven by a "configuration file", by one or more queries to one or more databases, or by some other stored means. Collectively, this control of the choice of character is referred to as "document driven" or "controlled by a document". The document (file, data base, or memory) may be editable and it may be stored on the test apparatus or externally and accessed by a network of other computer connection. Where a file or file format is used, it may be an XML file or file format.

In view of this disclosure it is noted that the various methods and devices described herein can be implemented in either software or hardware or a combination of the two to effect the testing of communications systems and components. Further, the various methods and parameters are included by way of example only and not in any limiting sense. Therefore, the embodiments described are illustrative and are useful in testing communications systems and components, and are not intended to limit the example embodiments. In view of this disclosure, those skilled in the art can implement the various example apparati and methods in testing communications equipment and systems, while remaining within the scope of the appended claims.

The invention claimed is:

1. A method of self-testing a tester, which includes a controller, a transmitter and a receiver, the method comprising:

a) conducting baseline tests of the tester including:

transmitting a plurality of test signals from the transmitter to at least one device under test, each test signal at a different power level;

receiving the test signals from the device under test at the recevier;

determining the power level of each test signal;

determining a BER for each test signal;

determining a baseline sensitivity of the receiver, defined by a minimum power level of test signal that the receiver requires to achieve a minimum BER limit;

b) storing the baseline sensitivity in a database accessible by the controller;

c) conducting self tests of the tester at periodic intervals including:

connecting the transmitter to the receiver via a loop-back connection;

transmitting a plurality of self-test signals from the transmitter, each self-test signal at a different power level;

receiving the plurality of self-test signals at the receiver via the loop back connection;

determining the power level of each self-test signal;

determining a BER for each self-test signal;

determining the sensitivity of the receiver at the periodic intervals by determining a minimum power level of test signal that the receiver requires to achieve a desired BER;

comparing the sensitivity at the periodic intervals with the baseline sensitivity previously stored in the database; and d) determining when recalibration of the tester is required based on the difference in sensitivity at each time interval and the baseline sensitivity.

2. The method of self-testing as recited in claim 1, wherein step a) includes adjusting a signal quality of each test signal; and wherein step c) includes adjusting a signal quality for each of the transmitted self-test signals.

3. The method as recited in claim 2, wherein adjusting the signal quality in steps a) and c) comprises stressing the self-test signal, and wherein the stressing comprises setting at least one of an Inter-Symbol Interference (ISI) caused by filtering the self-test signals, jitter of a transmitter data clock, and a noise interference level.

4. A testing apparatus adapted for self-testing, the testing apparatus comprising:

a transmitter that provides a plurality of self-test signals;

a receiver that receives the plurality of self-test signals;

a jumper connection for connecting the transmitter to the receiver;

a first monitor for measuring total average power of the self-test signals from the transmitter;

a second monitor for measuring total average power of the self-test signals entering the receiver after the jumper; and a controller that determines parametric results based on at least one of a setting of the testing apparatus, a parameter of the transmitted self-test signals and a parameter of the received self-test signals, that compensates the parametric results based on the comparison of the measurements from the first and second monitors, and that compares the parametric results to previously stored parametric data from a database to analyze calibration of the testing apparatus.

5. The testing apparatus as recited in claim 4, wherein the database comprises a process control database (PCD).

6. The testing apparatus as recited in claim 4, wherein the testing apparatus is an optical tester.

7. The testing apparatus as recited in claim 4, wherein the controller stresses the self-test signals, whereby the stressed signals include at least one of an Inter-Symbol Interference (ISI) caused by filtering, jitter of a data clock of the transmitter, and a noise interference.

8. The testing apparatus as recited in claim 4, wherein the jumper comprises a loopback switch, connected between the transmitter and the receiver, enabling the receiver to receive the plurality of self-test signals.

9. The testing apparatus as recited in claim 4, wherein the controller determines that the testing apparatus is not in calibration when a drift in the at least one parametric value exceeds a predetermined threshold.

10. A method for enabling substantially continued calibrated function of a testing device including a transmitter and a receiver, the method comprising:

self-testing the testing device at periodic intervals, wherein the self-testing comprises:

coupling the transmitter directly to the receiver via a jumper;

transmitting a plurality of self-test signals from the transmitter;

stressing the self-test signals with at least one of attenuation, dispersion, and interference;

receiving the plurality of self-test signals at the receiver;

storing the received self-test signals;

determining a power level and a BER for self-test signal, and the minimum power level required by the receiver to achieve a desired BER; and comparing the minimum power level with previously stored parametric data from a database to test calibration of a function of the testing device to determine when the testing device requires recalibration.

11. The method as recited in claim 10, wherein the self-test signals comprise optical signals.

* * * * *